(12) United States Patent
Yamazaki et al.

(10) Patent No.: US 8,043,939 B2
(45) Date of Patent: Oct. 25, 2011

(54) METHOD FOR MANUFACTURING SEMICONDUCTOR WAFER

(75) Inventors: Shunpei Yamazaki, Setagaya (JP); Akiharu Miyanaga, Hadano (JP); Ko Inada, Atsugi (JP); Yuji Iwaki, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/862,197

(22) Filed: Aug. 24, 2010

(65) Prior Publication Data

US 2010/0317161 A1  Dec. 16, 2010

Related U.S. Application Data

(62) Division of application No. 12/210,304, filed on Sep. 15, 2008, now Pat. No. 7,829,434.

(30) Foreign Application Priority Data

Sep. 21, 2007 (JP) .................. 2007-245809

(51) Int. Cl.
*H01L 21/762* (2006.01)
(52) U.S. Cl. .................. 438/458; 257/E21.568
(58) Field of Classification Search .......... 438/455, 438/457, 458; 257/E21.568
See application file for complete search history.

(56) References Cited

U.S. PATENT DOCUMENTS

| | | | |
|---|---|---|---|
| 4,529,571 A | 7/1985 | Bacon et al. | |
| 6,127,702 A | 10/2000 | Yamazaki et al. | |
| 6,271,101 B1 | 8/2001 | Fukunaga | |
| 6,335,231 B1 * | 1/2002 | Yamazaki et al. | 438/151 |
| 6,388,652 B1 | 5/2002 | Yamazaki et al. | |
| 6,468,923 B1 | 10/2002 | Yonehara et al. | |
| 6,566,158 B2 | 5/2003 | Eriksen et al. | |

(Continued)

FOREIGN PATENT DOCUMENTS

WO  WO-2007/014320  2/2007

(Continued)

OTHER PUBLICATIONS

Albritton.D et al., "Mobilities of Mass-Identified $H_3+$ and H+ Ions in Hydrogen,", Phys. Rev. (Physical Review), Jul. 5, 1968, vol. 171, No. 1, pp. 94-102.

(Continued)

*Primary Examiner* — Matthew Smith
*Assistant Examiner* — Daniel Shook
(74) *Attorney, Agent, or Firm* — Eric J. Robinson; Robinson Intellectual Property Law Office, P.C.

(57) ABSTRACT

To provide a method for manufacturing an SOI substrate having a single crystal semiconductor layer having a small and uniform thickness over an insulating film. Further, time of adding hydrogen ions is reduced and time of manufacture per SOI substrate is reduced. A bond layer is formed over a surface of a first semiconductor wafer and a separation layer is formed below the bond layer by irradiating the first semiconductor wafer with $H_3^+$ ions by an ion doping apparatus. $H_3^+$ ions accelerated by high voltage are separated to be three $H^+$ ions at a semiconductor wafer surface, and the $H^+$ ions cannot enter deeply. Therefore, $H^+$ ions are added into a shallower region in the semiconductor wafer at a higher concentration than the case of using a conventional ion implantation method.

20 Claims, 6 Drawing Sheets

U.S. PATENT DOCUMENTS

| | | | |
|---|---|---|---|
| 6,576,956 B2 * | 6/2003 | Kawanaka | 257/347 |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 7,148,124 B1 * | 12/2006 | Usenko | 438/458 |
| 7,176,525 B2 | 2/2007 | Fukunaga | |
| 7,256,776 B2 | 8/2007 | Yamazaki et al. | |
| 7,473,971 B2 | 1/2009 | Yamazaki et al. | |
| 7,476,576 B2 | 1/2009 | Yamazaki et al. | |
| 7,535,053 B2 | 5/2009 | Yamazaki | |
| 7,674,687 B2 | 3/2010 | Henley | |
| 7,911,016 B2 | 3/2011 | Henley | |
| 2003/0036247 A1 * | 2/2003 | Eriksen et al. | 438/455 |
| 2006/0151786 A1 * | 7/2006 | Nakanishi et al. | 257/61 |
| 2007/0108510 A1 | 5/2007 | Fukunaga | |
| 2007/0281440 A1 | 12/2007 | Cites et al. | |
| 2007/0291022 A1 | 12/2007 | Yamazaki et al. | |
| 2008/0038908 A1 * | 2/2008 | Henley | 438/530 |
| 2008/0246109 A1 | 10/2008 | Ohnuma | |
| 2010/0129950 A1 | 5/2010 | Henley | |
| 2010/0129951 A1 | 5/2010 | Henley | |

FOREIGN PATENT DOCUMENTS

| | | |
|---|---|---|
| WO | WO-2008/014339 | 1/2008 |

OTHER PUBLICATIONS

Chinese Office Action (Application No. 200810149494.4) Dated Jun. 9, 2011.

* cited by examiner

METHOD FOR MANUFACTURING SEMICONDUCTOR WAFER

BACKGROUND OF THE INVENTION

1. Field of the Invention

The present invention relates to a method for manufacturing a semiconductor wafer, particularly relates to a method for manufacturing a semiconductor wafer having a single crystal semiconductor layer over an insulating film, a semiconductor device using a semiconductor wafer having a single crystal semiconductor layer over an insulating film, and a method for manufacturing such a semiconductor device.

Note that in the present specification, "semiconductor devices" refers to devices in general, which can operate by utilizing semiconductor properties, and electro-optic devices, semiconductor circuits; electronic devices are all included in the category of semiconductor devices.

2. Description of the Related Art

Formation of a single crystal semiconductor layer over an insulating film is widely known as an SOI (silicon on insulator) technology. An SOI structure is a structure in which a silicon oxide film is embedded in a single crystal silicon substrate and a single crystal silicon thin film is provided thereover. A substrate having such an SOI structure is also referred to as an SOI substrate.

When an SOI structure used, since there is an insulating film below an element, a device isolation process can be simplified as compared with the case where an element is formed over a bulk silicon wafer; therefore, the number of process steps can be reduced. Further, semiconductor integrated circuits using an SOI substrate have been attracting attention because parasitic capacitance between a drain and a substrate in a transistor is reduced and the performance of the semiconductor integrated circuits is improved.

As a method for manufacturing an SOT substrate, for example, a hydrogen ion implantation separation method disclosed in Reference 1 (U.S. Pat. No. 6,372,609) is known. In a hydrogen ion implantation separation method, hydrogen ions are implanted in a silicon wafer by an ion implantation method, and thereby a microbubble layer is formed at a predetermined depth from the surface, and a thin silicon layer (SOI layer) is bonded to another silicon wafer using the microbubble layer as a cleavage plane. In addition to the heat treatment for separating an SOI layer, an oxide film is formed on the SOI layer by heat treatment in an oxidizing atmosphere and then, the oxide film is removed, and after that heat treatment is performed at 1000° C. to 1300° C. in a reducing atmosphere to increase bonding strength and reduce surface roughness.

An ion implantation method is also referred to as an ion introduction method, in which particles to be introduced into a sample in vacuum are ionized and accelerated by direct current or high frequency. An ion implanter using an ion implantation method includes an ion source, a mass separation unit, an acceleration unit, a beam scanner (electrostatic scan) unit, an introduction chamber (end-station), and an evacuation unit. Further, since an ion beam is not uniform, scanning with an ion beam is performed electrically in order to obtain uniformity of a surface of the sample. The introduced particles have a Gaussian distribution in the depth direction.

Further, Reference 2 (Japanese Published Patent Application No. 2000-12864) is known as an example of a semiconductor device using an SOI substrate. Reference 2 also discloses a technique in which hydrogen is introduced by an ion implantation method.

Further, Reference 3 (Japanese Published Patent Application No. H10-162770) discloses a linear doping apparatus by which a substrate is transferred without rotation.

SUMMARY OF THE INVENTION

Since hydrogen ions introduced into a semiconductor wafer by an ion implantation method have small mass, they are introduced to a region which is deep from a surface of the semiconductor wafer, so that the concentration peak of hydrogen ranges in a deep region. Accordingly, the deep region becomes a cleavage plane, so that the thickness of a semiconductor layer to be provided over an insulating film of another semiconductor wafer would be large as a result. Further, hydrogen is introduced in a wide range from a shallow area to a deep area, that is, a broad profile of hydrogen concentration is obtained; thus, ion implantation concentration varies.

In addition, an ion implantation method is performed by raster scan (also referred to dot sequential scanning) with an ion beam of a predetermined amount of current; therefore, ion implantation concentration varies in the semiconductor wafer. There is a risk that the cleavage plane would also become uneven reflecting the variation. Conventionally, polishing by machining has been performed for reducing the surface roughness of a semiconductor wafer after separation.

It is an object of the present invention to provide a method for manufacturing an SOI substrate having a single crystal semiconductor layer with small and highly uniform thickness over an insulating film.

Further, an ion implantation method is performed by raster scan with an ion beam of a predetermined amount of current; therefore, treatment time per semiconductor wafer is long.

In view of the above, it is another object of the present invention to reduce time of irradiation with hydrogen ions to reduce manufacturing time per SOI substrate.

A structure of the present invention disclosed in this specification is a method for manufacturing a semiconductor wafer, including the steps of forming a bond layer over a surface of a first semiconductor wafer; forming a separation layer below the bond layer by irradiating the first semiconductor wafer with $H_3^+$ ions by an ion doping apparatus; bonding the bond layer of the first semiconductor wafer to one surface of a second semiconductor wafer; and separating a part of the first semiconductor wafer along a cleavage plane which is inside the separation layer or which is an interface of the separation layer by performing heat treatment. The semiconductor wafer includes bond layer over the surface of the second semiconductor wafer and a single crystal semiconductor layer over the bond layer.

When a separation layer is formed in a semiconductor wafer, hydrogen plasma containing $H_3^+$ ions (triatomic hydrogen molecular ions) is generated, and $H_3^+$ ions in the plasma are accelerated by high voltage, and are added as ion current (ion shower) into the semiconductor wafer. This doping method is called an ion doping method or a plasma doping method, which are greatly different from an ion implantation method.

$H_3^+$ ions accelerated by high voltage were isolated at the semiconductor wafer surface to be three $H^+$ ions, and the $H^+$ ions to be applied to the semiconductor wafer cannot deeply enter the semiconductor wafer. Therefore, a shallower region in the semiconductor wafer can be irradiated with $H^+$ ions at high concentration than the case of using a conventional ion implantation method.

Further, since the three $H^+$ ions separated at the semiconductor wafer surface cannot enter deeply, hydrogen added into the semiconductor wafer is distributed within an area which is small in the depth direction. In other words, the concentration profile of hydrogen added into the semiconductor wafer is steep. Thus, hydrogen can be added into the semiconductor wafer at a more uniform concentration than the case of using a conventional ion implantation method, and an SOI substrate having a single crystal semiconductor layer with highly uniform film thickness over an insulating film.

Note that when hydrogen plasma is generated, the ratio of $H_3^+$ ions is preferably higher than that of $H^+$ ions in the hydrogen plasma. For example, in the hydrogen plasma, the ratio of $H_3^+$ ions is desirably 80% or more of the whole hydrogen plasma. When the ratio of $H_3^+$ ions is made higher than that of $H^+$ ions, a shallower region can be made into a cleavage plane. A shallower region is used as a cleavage plane; thus, an SOI substrate having a single crystal semiconductor layer with a small thickness over an insulating film can be formed.

Further, a doping method in which $H_3^+$ ions are added as ion flow into a semiconductor wafer can change the shape of the plane irradiated with the ion flow. The doping treatment is performed on the entire surface of the semiconductor wafer by generating ion flow with which an elongated linear plane or an elongated oblong plane is irradiated, and moving the semiconductor wafer in the direction perpendicular to the longitudinal direction of the shape of the plane irradiated with ion flow. In this manner, the time of introduction of hydrogen ions can be reduced and the manufacturing time per SOI substrate can be reduced.

When a first semiconductor wafer over which the separation layer is formed is bonded to a second semiconductor wafer, a silicon oxide film formed by plasma CVD using organosilane is preferably used as a source material for one or both of the surfaces to be bonded. As the organosilane gas, a silicon containing compound such as ethyl silicate (TEOS: chemical formula: $Si(OC_2H_5)_4$), tetramethylsilane (TMS: chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), tris(dimethylamino)silane ($SiH(N(CH_3)_2)_3$) is used.

The silicon oxide film formed by plasma CVD is a bond layer, which preferably has a smooth surface and forms a hydrophilic surface. The bond layer which has a smooth surface and forms a hydrophilic surface is provided with a thickness of 5 nm to 500 nm. Such a thickness makes it possible to smooth surface roughness of a surface on which a film is to be formed and also to ensure smoothness of a growing surface of the film. Further, distortion between the first semiconductor wafer and the second semiconductor wafer which are to be bonded can be alleviated. The second semiconductor wafer may also be provided with the same silicon oxide film. Accordingly, when a bond layer of a silicon oxide film formed preferably using organosilane as a source material is provided on one or both of the surfaces to be bonded, strong bonding can be performed. Van der Waals force acts on the bonding and the first semiconductor wafer and the second semiconductor wafer can be bonded more firmly by hydrogen coupling by making them contact closely.

Further, a chemical oxide can also be used for the bond layer. A chemical oxide can be formed, for example, by treating a surface of a semiconductor wafer with aqueous solution containing ozone. A chemical oxide is preferably used because it is formed reflecting the planarity of the surface of the semiconductor wafer.

$H_3^+$ ions are introduced preferably after forming the bond layer over the first semiconductor wafer surface. Therefore, $H_3^+$ ions are to be introduced through the bond layer. The bond layer can prevent the surface from being damaged and losing its flatness by an ion doping method. Note that in this specification, introduction of only $H_3^+$ ion species is also referred to as ion doping.

Further, after the first semiconductor wafer and the second semiconductor wafer are bonded, heat treatment is performed to separate the first semiconductor wafer and the second semiconductor wafer along a cleavage plane which is inside the separation layer or which is an interface of the separation layer. The heat treatment is preferably performed at a temperature ranging from the temperature at which the bond layer is formed to the upper temperature limit of the semiconductor wafer. The first semiconductor wafer and the second semiconductor wafer can be bonded at a temperature of 700° C. or less by using a silicon oxide film formed by plasma CVD as the bond layer. For example, when the heat treatment is performed at 400° C. to 600° C., the volume of microvoids formed in the separation layer is changed, so that a cleavage can be created inside the separation layer or along an interface of the separation layer. The separation layer is bonded to the second semiconductor wafer, so that a single crystal semiconductor layer having the same crystallinity as the first semiconductor wafer remains over the second semiconductor wafer.

As compared with an SOI substrate obtained by a conventional hydrogen ion implantation separation method, an SOI substrate having a single crystal semiconductor layer having a smaller and more uniform thickness over an insulating film can be manufactured.

Moreover, as compared with a method for manufacturing an SOI substrate using a conventional ion implantation method, the time of introduction of hydrogen ions can be reduced and the manufacturing time per SOI substrate can be reduced.

DETAILED DESCRIPTION OF THE INVENTION

Embodiment Mode of the present invention will now be described.

Embodiment Mode

A method for manufacturing an SOI substrate will be described below with reference to FIGS. 1A to 1D.

First, a bond layer 102 is formed over a first semiconductor wafer 101. A semiconductor wafer manufactured by thinly cutting a single crystal semiconductor ingot is used for a first semiconductor wafer 101. Here, a 5-inch single crystal silicon wafer (diameter: 125 mm) having (100) crystal orientation of is taken as an example of the first semiconductor wafer 101. Note that an 8-inch single crystal silicon wafer (diameter: 200 mm) or a 12-inch single crystal silicon wafer (diameter: 300 mm) can be used if necessary. Note that a semiconductor wafer provided with an orientation flat indicating the crystal orientation on a part of the periphery may be used as the first semiconductor wafer 101. An orientation flat can be referenced at the time of ion doping. Alternatively, the semiconductor wafer 101 to be used may have (110) crystal orientation or (111) crystal orientation.

A silicon oxide film manufactured by a chemical vapor deposition method using an organosilane gas is used as the bond layer 102. In this embodiment mode, the bond layer is formed to a thickness of 100 nm by PCVD using an organosilane gas of ethyl silicate (TEOS: chemical formula: $Si(OC_2H_5)_4$).

Figure 1A:
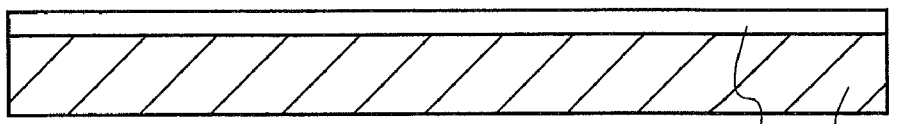
FIGS. 1A to 1D illustrate a manufacturing method of an SOI substrate.
Figure 1B:
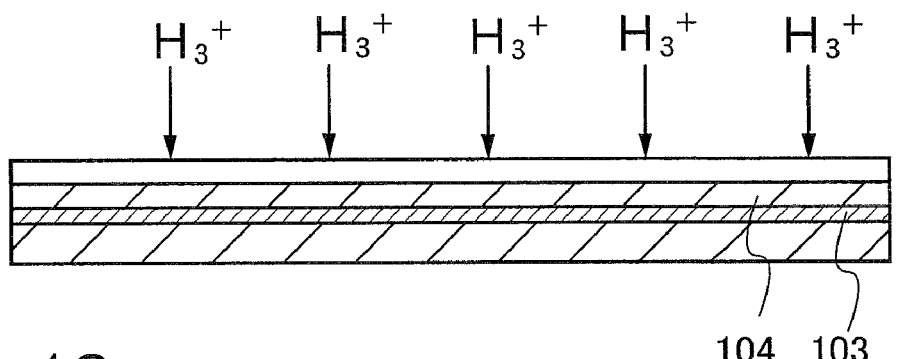

A cross-sectional process view of the steps so far corresponds to FIG. 1A.

Next, $H_3^+$ ions are introduced into the first semiconductor wafer 101 through the bond layer 102 by an ion doping method. A separation layer 103 which is a region containing much hydrogen is formed by the introduction of $H_3^+$ ions. Further, a single crystal semiconductor layer 104 is formed between the separation layer 103 and the bond layer 102. The thickness of the single crystal semiconductor layer 104 is determined depending on the position of the separation layer 103 in the depth direction. Accordingly, the thickness of the single crystal semiconductor layer 104 depends on the doping conditions (accelerating voltage and the like) of $H_3^+$ ions. When the ratio of $H_3^+$ ions is increased, introduction efficiency can be increased, so that introduction time can be reduced.

Here, concentration distribution of hydrogen ions introduced by an ion doping method will be described.

The present inventors performed an experiment of introducing hydrogen ions into a semiconductor wafer (a silicon wafer of (100) plane crystal orientation) using an ion doping apparatus. The present inventors set some models of introduction based on the result data of the SIMS analysis and calculated the number of hydrogen ions and defects with respect to the depth direction. Further, the calculation was performed using a model with the size of (x-axis, y-axis, z-axis)=(800 nm, 800 nm, 1200 nm). Note that the x-axis and the y-axis correspond to the Si wafer plane, and the z-axis corresponds to the depth direction. Further, in the ion doping apparatus used for the experiment, the wafer is rotated to achieve uniform introduction distribution of ions.

The number of ions and the number of defects caused by collision of ions to atoms (silicon atoms or oxygen atoms) in the film in the case of introducing the ions by an ion doping method into the first semiconductor wafer 101 from the surface provided with the bond layer 102 with a film thickness of 100 nm, were calculated by a Monte Carlo method. Further, the calculation was performed assuming that the accelerating voltage was 80 keV. Note that the bond layer 102 is a silicon oxide film having an amorphous structure, which has been obtained using an organosilane gas of ethyl silicate.

Figure 2A:
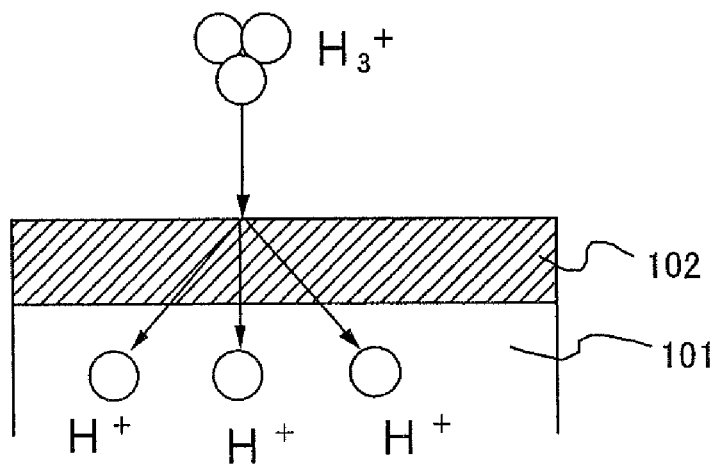
FIGS. 2A and 2B are a first diagram, and a graph illustrating the number of ions or the number of defects with respect to the direction of the depth calculated based on the first model diagram, respectively.
Figure 2B:
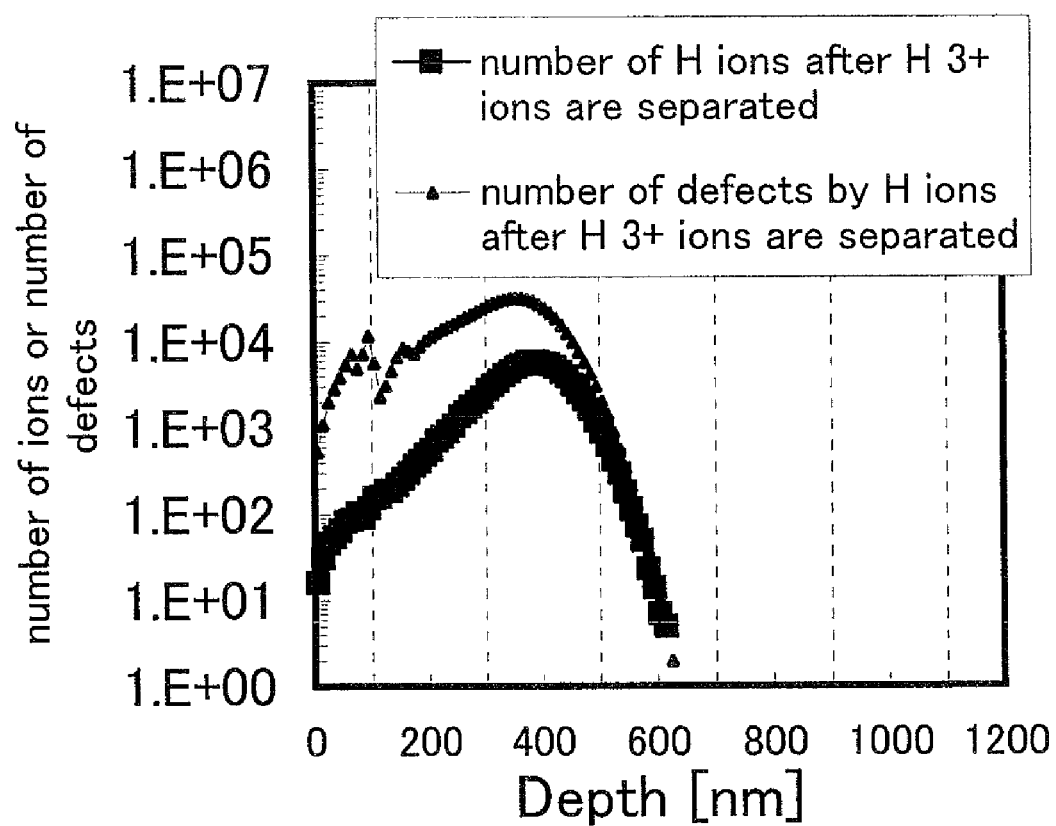

FIG. 2A is a first model diagram illustrating the case where $H_3^+$ ions are accelerated by an accelerating voltage of 80 keV and are separated at the first semiconductor wafer surface, namely, the bond layer 102 surface, to be three $H^+$ ions. FIG. 2B is a graph illustrating the number of ions or the number of defects in the depth direction, which have been calculated based on the first model diagram. Note that the depth corresponding to the horizontal axis of the graph represents the depth from a surface, including the thickness of the silicon oxide film (bond layer 102) of 100 nm.

Figure 3A:
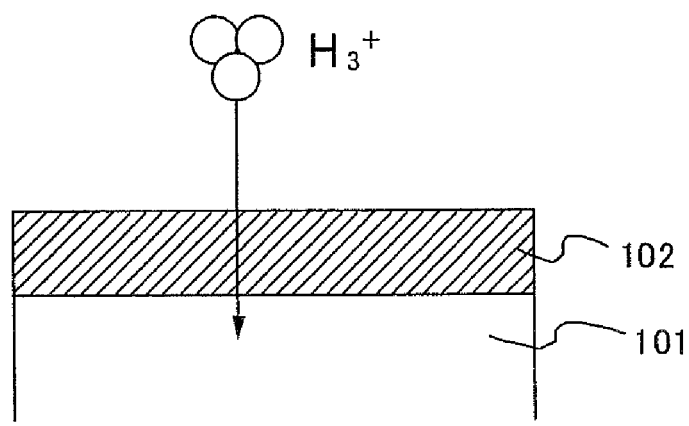
FIGS. 3A and 3B are a second model diagram and a graph illustrating the number of ions or the number of defects with respect to the direction of the depth calculated based on the second model diagram, respectively.
Figure 3B:
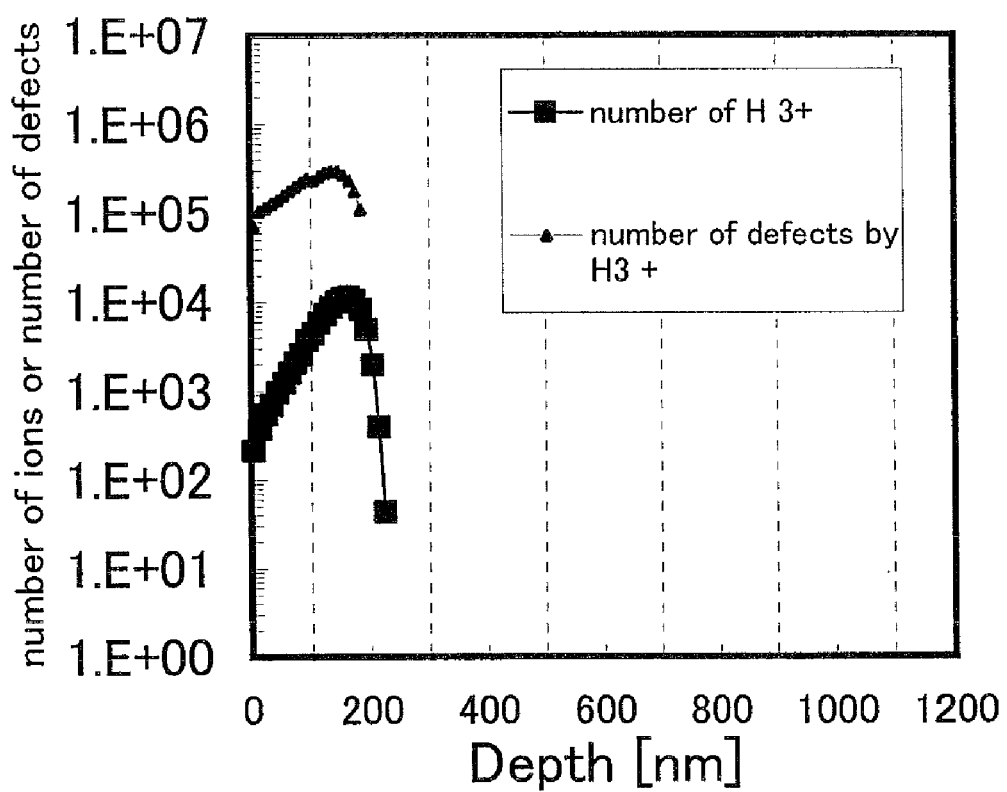

Further, FIG. 3A is a second model diagram illustrating the case where $H_3^+$ ions are accelerated by an accelerating voltage of 80 keV and introduced into the first semiconductor wafer as they are. FIG. 3B is a graph illustrating the number of ions or the number of defects in the depth direction, which have been calculated based on the second model diagram.

Figure 4A:
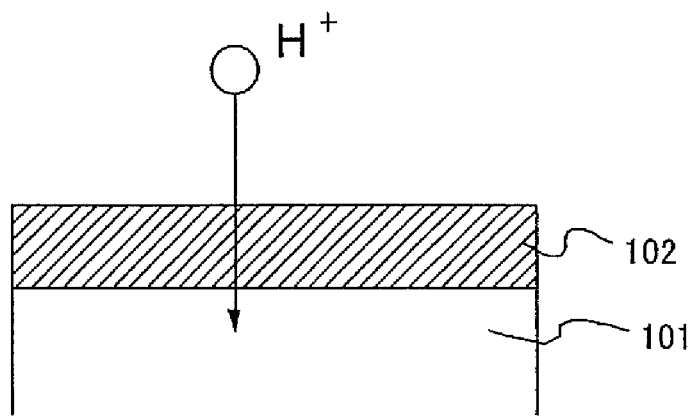
FIGS. 4A and 4B are a third diagram, and a graph illustrating the number of ions or the number of defects with respect to the direction of the depth calculated based on the third model diagram, respectively.
Figure 4B:
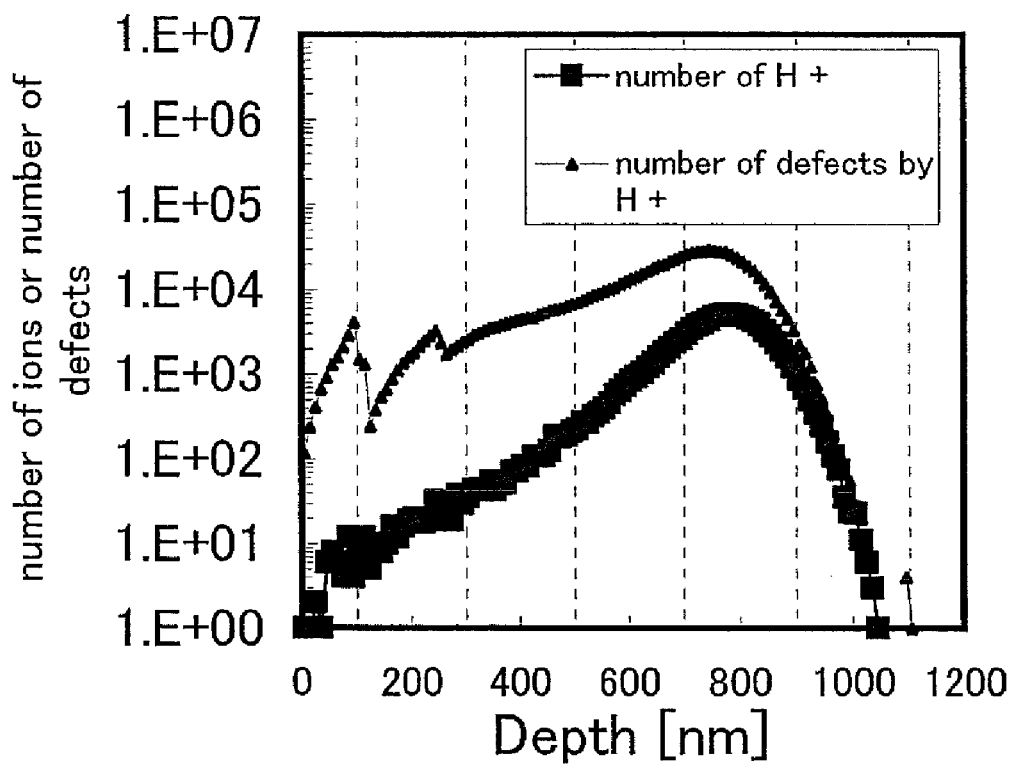

Further, FIG. 4A is a third model diagram illustrating the case where $H^+$ ions are accelerated by an accelerating voltage of 80 keV and introduced into the first semiconductor wafer as they are. FIG. 4B is a graph illustrating the number of ions or the number of defects in the depth direction, which have been calculated based on the third model diagram.

FIG. 4B shows that the $H^+$ ions are introduced deeply, and the peak of hydrogen concentration is in the neighborhood of a depth of 800 nm. Further, in the deepest region, hydrogen ions are introduced to a depth of more than 1100 nm from the surface; thus, it is shown that the hydrogen ions are introduced to a wide range of area from the shallow region to the deep region. This would be a risk of causing variation in the concentration of implanted ions in the wafer.

FIG. 3B shows that the $H_3^+$ ions are introduced shallowly, and the peak of hydrogen concentration is in the neighborhood of a depth of 150 nm. Further, in the deepest region, hydrogen ions are only introduced to a depth of more than 200 nm from the surface. Moreover, since the peak of the number of the defects is in the neighborhood of 150 nm that is substantially the same as the peak of the hydrogen concentration, hydrogen ions are considered to collide with atoms (silicon atoms or oxygen atoms) in the vicinity of the surface. The bond energy between hydrogen ions of $H_3^+$ ions is approximately 22.6 eV, which is extremely low as compared with an accelerating voltage of 80 keV; therefore, actually, most of $H_3^+$ ions are considered to separate into three $H^+$ ions on the collision phase.

Accordingly, the present inventors consider that the first model diagram of FIG. 2A is close to the state of introducing $H_3^+$ ions. FIG. 2B shows that the $H^+$ ions are introduced shallowly as compared with the result of introducing $H^+$ ions in FIG. 4B, and the peak of hydrogen concentration is in the neighborhood of a depth of 400 nm. Further, in the deepest region, hydrogen ions are only introduced to a depth of more than 600 nm from the surface. The reason that the ions are introduced into a shallower region in the calculation result of the first model diagram than in the calculation result of the third model diagram is considered because kinetic energy was consumed as energy of dissociation at the time of separation into three $H^+$ ions.

Further, here, the calculation result of the case where the accelerating voltage is 80 keV is shown; however, it is needless to say that the position of the peak of hydrogen concentration can be controlled by controlling the value of the accelerating voltage. Moreover, the calculation result of the case where the bond layer is a 100 nm thick silicon oxide film is shown; however, it is needless to say that the thickness of the single crystal semiconductor layer 104 can by controlled by controlling the thickness. The thickness of the single crystal semiconductor layer 104 is 5 nm to 500 nm, preferably 10 nm to 200 nm. It is difficult to achieve such a small thickness using a conventional ion implantation method for manufacturing a SOI substrate without performing process steps for reducing the film thickness by polishing or etching after a separation process. Since a semiconductor wafer is high cost, reduction in the thickness by polishing or etching leads to the loss of material. In addition, even in the case of performing polishing or etching after separation, polishing or etching can be performed in a shorter time as compared with the manufacturing process of an SOI substrate using a conventional ion implantation method. Further, the loss of material can be reduced even if polishing or etching is performed after separation. Further, the rest of the separated first semiconductor wafer can be reused; therefore, the larger the thickness of the rest of the semiconductor wafer is, the more SOI substrates can be manufactured from a single first semiconductor wafer.

Next, after cleaning a surface of the bond layer 102, the bond layer 102 is made closely contact to one surface of a second semiconductor wafer 105, so that the first semiconductor wafer 101 and the second semiconductor wafer 105 are piled together and bonded. Note that the surface of the second semiconductor wafer 105 which is to be bonded is sufficiently cleaned in advance. When the first semiconductor wafer 101 and the second semiconductor wafer 105 are piled together and at least one portion is lightly pressed from the external, distance between the surfaces to be bonded is locally decreased; therefore, van der Waals force gets stronger, and hydrogen bonding further contributes to attraction between the first semiconductor wafer 101 and the second semiconductor wafer 105 and bonding therebetween. Further, even in the neighboring regions, the distance between the opposed substrates is reduced; thus, a region on which van der Waals force strongly acts or a region affected by hydrogen bonding spreads, the bonding is promoted and spreads throughout the entire bonding surface.

After the first semiconductor wafer 101 and the second semiconductor wafer 105 are bonded to each other with the bond layer 102, heat treatment or pressure treatment is preferably performed. Heat treatment or pressure treatment makes it possible to increase bonding strength. Pressure treatment is performed so that pressure is applied in the direction perpendicular to the bonding surface, considering resistance to pressure of the first semiconductor wafer 101 and the second semiconductor wafer 105.

Figure 1C:
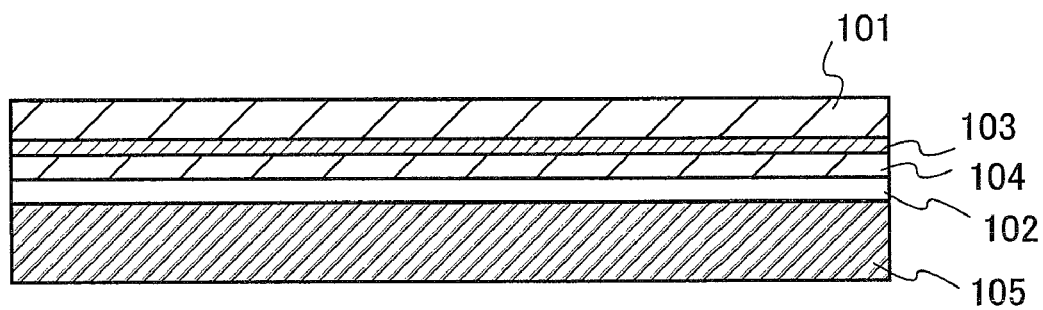

A cross-sectional process view of the steps so far corresponds to FIG. 1C.

Next, when the heat treatment is performed at 400° C. to 600° C., the volume of microvoids formed in the separation layer 103 is changed, so that a cleavage can be created inside the separation layer 103 or along an interface of the separation layer. Further, heat treatment here increases the bonding strength of the bond layer. Heat treatment can be performed using a furnace for heating or by irradiation a laser beam.

Figure 1D:
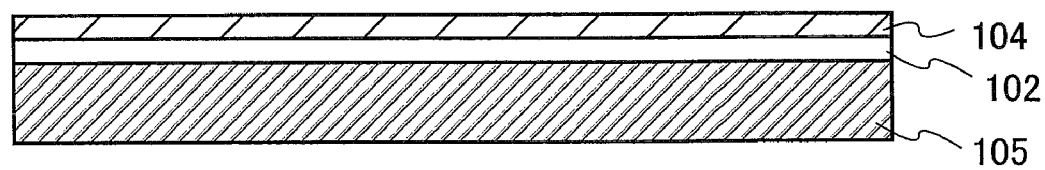

Through the above steps, the SOI substrate shown in FIG. 1D can be obtained. The SOI substrate shown in FIG. 1D has a bond layer 102 over the second semiconductor wafer 105, and the single crystal semiconductor layer 104 over the bond layer 102.

Further, it is preferable that a process step of processing the periphery area of the SOI substrate is added so that the process can support a manufacturing apparatus of a semiconductor device as well as a semiconductor wafer.

The present invention having the above structure will be described in detail with embodiments shown below.

Embodiment 1

Figure 5:
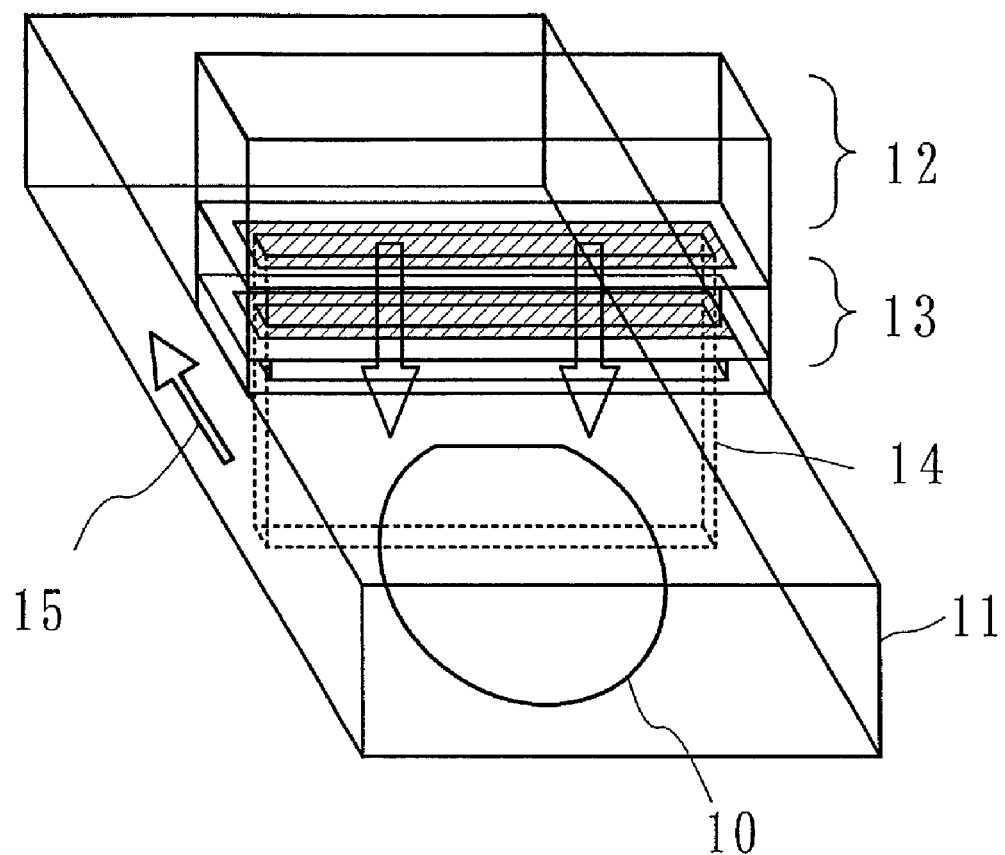
FIG. 5 is a perspective view illustrating an ion doping apparatus.
Figure 6A:
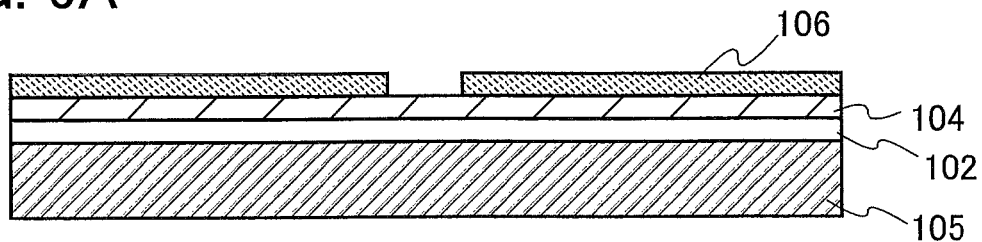
FIGS. 6A to 6E illustrate a manufacturing process of a transistor.
Figure 6B:
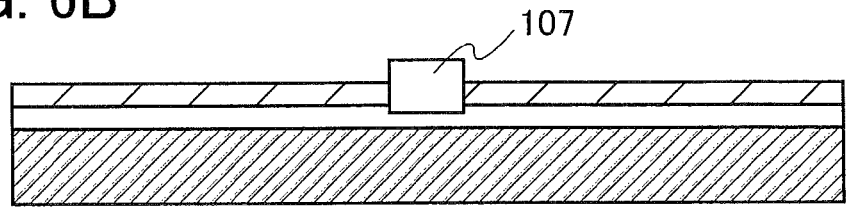
Figure 6C:
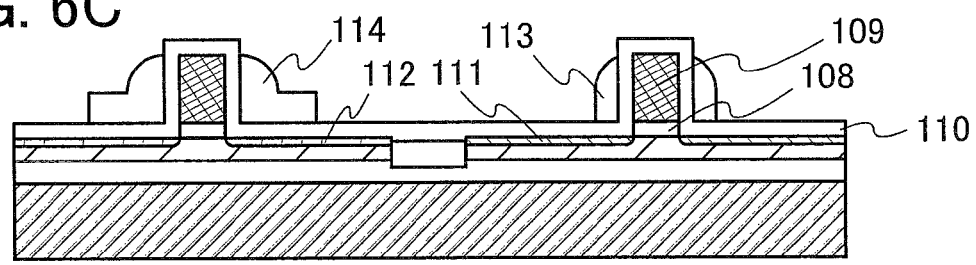
Figure 6D:
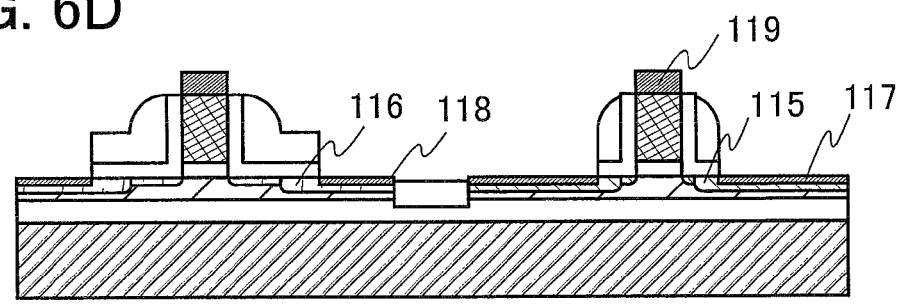
Figure 6E:
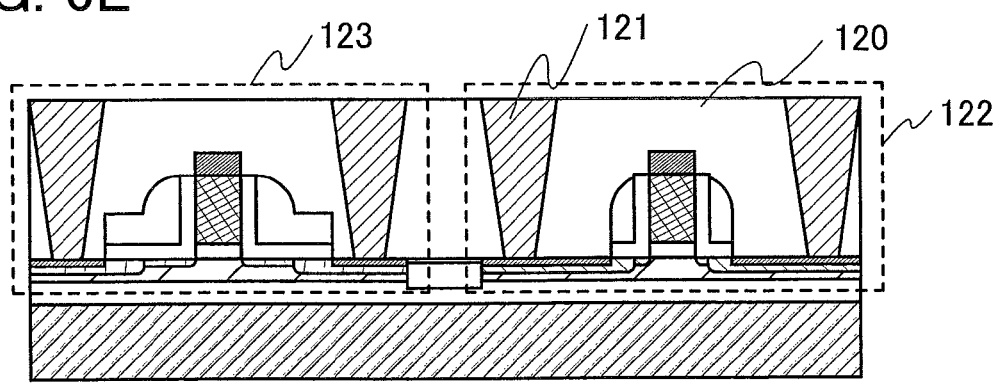

In Embodiment Mode, an example of using a doping apparatus which rotates a semiconductor wafer was taken for example; however, in this embodiment, an example of a doping apparatus for making the form of ion flow into a desired form, and transferring a semiconductor wafer will be shown. FIG. 5 is a perspective view illustrating an example of such a doping apparatus.

An ion source 12 includes a filament for emitting hot electrons which is provided in a chamber which is a plasma chamber and a plurality of permanent magnet rings arranged around the chamber so that the polarities are alternated.

Further, an accelerating electrode portion 13 includes an ion trap electrode of which potential is maintained at the same potential as the chamber, which is an anode, an extraction electrode of which potential is maintained at a potential lower than the potential of the ion trap electrode by several kV, and an accelerating electrode of which potential is maintained at a potential lower than the potential of the extraction electrode at the bottom opening of the chamber. Note that the ion trap electrode, the extraction electrode, and the accelerating electrode are grid electrodes.

Further, ON/OFF of irradiation may be controlled by open/close operation of a shutter provided for blocking an ion beam.

Electrons emitted from the filament is applied to a working gas (hydrogen, phosphine, diborane, or the like) introduced into the chamber from a gas inlet to generate plasma; while the plasma is confined in the chamber with the magnetic field of the permanent magnet, the electric field is applied by the extraction electrode to extract ions in the plasma through the ion trap electrode, and the ions are accelerated by the electric field of the accelerating electrode to generate an ion beam 14.

Then, the inside of a doping chamber 11 is irradiated with the ion beam 14 and ions are added to the semiconductor wafer 10. The plane of the semiconductor wafer is kept in the direction perpendicular to the direction of irradiation with the ion beam 14. Doping of the entire semiconductor wafer surface is performed under the conditions where the shape of a plane irradiated with the ion beam 14 on the semiconductor wafer is linear or oblong by transferring the semiconductor wafer in the direction perpendicular to the longitudinal direction of the plane irradiated with the ion beam 14.

Further, when the shape of the plane irradiated with the ion beam 14 is linear or oblong, variation in the concentration of ions introduced into the semiconductor wafer can be reduced as compared with the case of performing raster scan.

The semiconductor wafer 10 is moved in a scan direction 15 to pass under the ion source 12 using a wafer transfer robot. The semiconductor wafer 10 may be moved in the scan direction with the use of a rail and a driver geared motor without limitation to a robot.

Further, the entire surface of the semiconductor wafer 10 can be irradiated by one time transfer in a scan direction 15 which is a straight line direction; therefore, irradiation of the entire surface of the semiconductor wafer can be completed in a shorter time than the case of performing raster scan.

Further, without limitation to the above apparatus structure in FIG. 5, an apparatus may have a structure in which irradiation with an ion beam is performed in the horizontal direction with the substrate in a state of inclination, which is made almost vertical because particles issue.

Without limitation to the doping apparatus structure, an ion focusing device or the like, which are known in a conventional ion doping technology, can be added to the doping apparatus.

Further, this embodiment can be freely combined with Embodiment Mode.

Embodiment 2

In this embodiment, a method for manufacturing a semiconductor device using an SOI substrate manufactured in accordance with Embodiment Mode. Here, an example of manufacturing a CMOS structure as the semiconductor device will be described with reference to FIGS. 6A to 6E. Note that parts in FIGS. 6A to 6E which are like parts in FIGS. 1A to 1D are denoted by the same reference numerals as in FIGS. 1A to 1D.

According to Embodiment Mode, the single crystal semiconductor layer 104 of the SOI substrate can be formed to a thickness of 100 nm or less. When the thickness of the single crystal semiconductor layer 104 is 100 nm or less, the thickness is smaller than the maximum depth of a depletion layer in channel formation region of a transistor, which results in significant electrical characteristics of the transistor. When a sufficient depletion layer is obtained in the transistor, a sub-threshold swing, a threshold voltage, and the like, which are almost ideal can be obtained. In addition, in the case where a CMOS structure is manufactured, high switching speed can be achieved.

First, after an SOI substrate is obtained in accordance with Embodiment Mode, a protective layer 106 serving as a mask for forming an isolation insulating layer is formed over the single crystal semiconductor layer 104. This step is illustrated in a process cross-sectional view of FIG. 6A. A silicon oxide film or a silicon nitride film is used as the protective layer 106.

Note that in order to control threshold voltage, a p-type impurity such as boron, aluminum, or gallium is preferably added to the single crystal semiconductor layer 104. For example, the single crystal semiconductor layer 104 may be doped with boron as a p-type impurity at a concentration of $5\times10^{17}$ cm$^{-3}$ to $1\times10^{18}$ cm$^{-3}$.

Next, etching is performed using the protective layer 106 as a mask to remove exposed part of the single crystal semiconductor layer 104 and part of the bond layer 102 therebelow. Then, a silicon oxide film is deposited by a chemical vapor deposition method using TEOS. The silicon oxide film is thickly deposited so that the single crystal semiconductor layer 104 is embedded. Then, after the silicon oxide film stacked over the single crystal semiconductor layer 104 is removed by polishing, the protective layer 106 is removed, and the element isolation insulating layer 107 is made to remain. The steps correspond to a process cross-sectional view of FIG. 6B.

Next, a first insulating film is formed, a gate electrode 109 having a polysilicon film containing a conductive material is formed over the first insulating film, and the first insulating film is etched using the gate electrode as a mask to form a gate insulating layer 108. Then, a second insulating film 110 covering the gate electrode 109 is formed, and further, sidewall insulating layers 113 and 114 are formed. The sidewall insulating layer 114 of a region to be a pFET is larger in width than the sidewall insulating layer 113 of a region to be an nFET. Then, the region to be the nFET is doped with As or the like to form a first impurity region 111 with a shallow junction depth, and the region to be the pFET is doped with B or the like to form a second impurity region 112 with a shallow junction depth. The steps correspond to a process cross-sectional view of FIG. 6C.

Next, the second insulating film 110 is partially etched so that the top surface of the gate electrode 109, the first impurity region 111, and the second impurity region 112 are exposed. Next, a region to be the nFET is doped with As or the like to form a third impurity region 115 with a deep junction depth, and a region to be the pFET is doped with B or the like to form a fourth impurity region 116 with a deep junction depth. Then, heat treatment (800° C. to 1100° C.) is performed for activation. Then, a cobalt film is formed as a metal film for forming a silicide. Then, heat treatment such as RTA (at 500° C. for one minute) is performed to form a silicide from silicon of a part in contact with the cobalt film. As a result, a silicide portion 119 is formed over the gate electrode 109 and silicide portions 117 and 118 are formed over the third impurity region 115 and the fourth impurity region 116, respectively. After that, the cobalt film is selectively removed. Next, heat treatment is performed at a temperature higher than the heat treatment for forming the silicide to reduce resistance of the silicide portions 117, 118, and 119. The stage here corresponds to a process cross-sectional view of FIG. 6D.

Then, an interlayer insulating film 120 is formed, and contact plugs 121 are formed to be electrically connected to the third impurity region 115 with a deep junction depth and the fourth impurity region 116 with a deep junction depth. Thus, an nFET 122 and a pFET 123 can be manufactured using the single crystal semiconductor layer 104 bonded to the second semiconductor wafer 105. The stage here corresponds to a process cross-sectional view of FIG. 6E.

The nFET 122 and the pFET 123 are complementarily combined to form a CMOS structure.

Wirings or elements are additionally stacked on the CMOS structure, so that a semiconductor device such as a microprocessor can be manufactured. Note that a microprocessor includes an arithmetic logic unit (also referred to as an ALU), an arithmetic logic unit controller (ALU controller), an instruction decoder, an interrupt controller, a timing controller, a register, a register controller, a bus interface (bus I/F), a read only memory, and a memory interface (ROM I/F).

In the microprocessor, an integrated circuit having a CMOS structure is formed; therefore, processing speed is increased and besides, power consumption can be reduced.

Further, this embodiment can be freely combined with Embodiment Mode or Embodiment 1.

The present invention can contribute to provision of SOI substrates at lower cost than conventional, and reduction in manufacturing cost of semiconductor devices using SOI substrates.

This application is based on Japanese Patent Application serial No. 2007-245809 filed with Japan Patent Office on Sep. 21, 2007, the entire contents of which are hereby incorporated by reference.

What is claimed is:

1. A method for manufacturing a semiconductor wafer comprising the steps of:
    forming a bond layer over a surface of a first semiconductor wafer;
    forming a separation layer below the bond layer by irradiating the first semiconductor wafer with hydrogen molecular ions by an ion doping apparatus comprising an ion source including a gas inlet to introduce hydrogen as a working gas, a filament for emitting thermo electrons and a plurality of magnet rings arranged around a chamber;
    bonding the bond layer of the first semiconductor wafer to one surface of a second semiconductor wafer; and
    separating a part of the first semiconductor wafer along a cleavage plane which is inside the separation layer or which is an interface of the separation layer by performing heat treatment;
    wherein the second semiconductor wafer includes the bond layer over the surface of the second semiconductor wafer and a single crystal semiconductor layer over the bond layer.

2. A method for manufacturing a semiconductor wafer according to claim 1, wherein the hydrogen molecular ions include $H_3^+$ ions.

3. A method for manufacturing a semiconductor wafer according to claim 1, wherein the bond layer is an insulating film containing silicon oxide which is obtained by plasma CVD.

4. A method for manufacturing a semiconductor wafer according to claim 1, wherein irradiating with hydrogen molecular ions is performed by transferring the first semiconductor wafer in a first direction, wherein the shape of an irradiated plane on the semiconductor wafer is linear or oblong and a longitudinal direction of the irradiated plane is perpendicular to the first direction.

5. A method for manufacturing a semiconductor wafer according to claim 1, wherein a second bond layer is formed over the surface of the second semiconductor wafer before bonding the bond layer of the first semiconductor wafer to one surface of the second semiconductor wafer.

6. A method for manufacturing a semiconductor wafer according to claim 1, wherein the first semiconductor wafer has (100) plane crystal orientation.

7. A method for manufacturing a semiconductor device comprising the steps of:
forming a bond layer over a surface of a first semiconductor wafer comprising single crystal semiconductor;
forming a separation layer below the bond layer by irradiating the first semiconductor wafer with hydrogen molecular ions by an ion doping apparatus comprising a gas inlet to introduce hydrogen as a working gas, an ion source including a filament for emitting thermo electrons and a plurality of magnet rings arranged around a chamber;
bonding the bond layer of the first semiconductor wafer to one surface of a second semiconductor wafer;
forming a single crystal semiconductor layer on the second semiconductor wafer by separating a part of the first semiconductor wafer along a cleavage plane which is inside the separation layer or which is an interface of the separation layer by performing heat treatment;
forming an element isolation insulating layer in the single crystal semiconductor layer;
forming a gate electrode over the single crystal semiconductor layer with a first insulating film therebetween;
forming side wall insulating layers;
forming impurity regions in the single crystal semiconductor layer; and
forming a silicide on the gate electrode and the impurity regions;
wherein the second semiconductor wafer includes the bond layer over the surface of the second semiconductor wafer and the single crystal semiconductor layer over the bond layer.

8. A method for manufacturing a semiconductor device according to claim 7, wherein the hydrogen molecular ions include $H_3^+$ ions.

9. A method for manufacturing a semiconductor device according to claim 7, wherein the bond layer is an insulating film containing silicon oxide which is obtained by plasma CVD.

10. A method for manufacturing a semiconductor device according to claim 7, wherein irradiating with hydrogen molecular ions is performed by transferring the first semiconductor wafer in a first direction, wherein the shape of an irradiated plane on the first semiconductor wafer is linear or oblong and a longitudinal direction of the irradiated plane is perpendicular to the first direction.

11. A method for manufacturing a semiconductor device according to claim 7, wherein another bond layer is formed over the surface of the second semiconductor wafer, which is further bonded to the bond layer of the first semiconductor wafer.

12. A method for manufacturing a semiconductor device according to claim 7, wherein the first semiconductor wafer has (100) plane crystal orientation.

13. A method for manufacturing a semiconductor device according to claim 7, wherein the single crystal semiconductor layer comprises silicon.

14. A method for manufacturing a semiconductor device comprising the steps of:
forming an element isolation insulating layer in a single crystal semiconductor layer, the single crystal semiconductor layer formed over a first semiconductor wafer with a bond layer therebetween;
forming a gate electrode over the single crystal semiconductor layer with a first insulating film therebetween;
forming side wall insulating layers; and
forming impurity regions in the single crystal semiconductor layer;
wherein the single crystal semiconductor layer is formed by the steps of,
forming a separation layer by irradiating a surface of a second semiconductor wafer comprising single crystal semiconductor with hydrogen molecular ions by an ion doping apparatus comprising an ion source including a gas inlet to introduce hydrogen as a working gas, a filament for emitting thermo electrons and a plurality of magnet rings arranged around a chamber;
bonding the surface of the second semiconductor wafer to the first semiconductor wafer; and
separating a part of the second semiconductor wafer along a cleavage plane which is inside the separation layer or which is an interface of the separation layer by performing heat treatment.

15. A method for manufacturing a semiconductor device according to claim 14, wherein the hydrogen molecular ions include $H_3^+$ ions.

16. A method for manufacturing a semiconductor device according to claim 14, wherein the bond layer is an insulating film containing silicon oxide which is obtained by plasma CVD.

17. A method for manufacturing a semiconductor device according to claim 14, wherein irradiating with hydrogen molecular ions is performed by transferring the first semiconductor wafer in a first direction, wherein the shape of an irradiated plane on the second semiconductor wafer is linear or oblong and a longitudinal direction of the irradiated plane is perpendicular to the first direction.

18. A method for manufacturing a semiconductor device according to claim 14, wherein another bond layer is formed over the first semiconductor wafer, which is further bonded to the bond layer of the second semiconductor wafer.

19. A method for manufacturing a semiconductor device according to claim 14, wherein the second semiconductor wafer has (100) plane crystal orientation.

20. A method for manufacturing a semiconductor device according to claim 14, wherein the single crystal semiconductor layer comprises silicon.

* * * * *